US010153211B1

(12) United States Patent
Wang et al.

(10) Patent No.: US 10,153,211 B1
(45) Date of Patent: Dec. 11, 2018

(54) METHODS, APPARATUS, AND SYSTEM FOR FABRICATING FINFET DEVICES WITH INCREASED BREAKDOWN VOLTAGE

(71) Applicant: GLOBALFOUNDRIES INC., Grand Cayman (KY)

(72) Inventors: Yanzhen Wang, Clifton Park, NY (US); Xinyuan Dou, Clifton Park, NY (US); Sipeng Gu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/616,681

(22) Filed: Jun. 7, 2017

(51) Int. Cl.
*H01L 21/8238* (2006.01)
*H01L 21/8234* (2006.01)
*H01L 27/088* (2006.01)
*H01L 29/49* (2006.01)
*H01L 23/535* (2006.01)
*H01L 23/532* (2006.01)

(52) U.S. Cl.
CPC ........ *H01L 21/823468* (2013.01); *H01L 21/823431* (2013.01); *H01L 21/823475* (2013.01); *H01L 23/535* (2013.01); *H01L 23/53266* (2013.01); *H01L 27/0886* (2013.01); *H01L 29/4983* (2013.01)

(58) Field of Classification Search
None
See application file for complete search history.

(56) References Cited

U.S. PATENT DOCUMENTS 9,768,077 B1 *  9/2017  Adusumilli ..... H01L 21/823814

* cited by examiner

*Primary Examiner* — Long Pham
(74) *Attorney, Agent, or Firm* — Williams Morgan, P.C.

(57) ABSTRACT

At least one method, apparatus and system is disclosed herein for forming a fin field effect transistor (finFET) device having a reduced breakdown voltage. The method comprises forming a first gate structure on a substrate of a semiconductor wafer in a first layer, the gate structure extending to a height of about h above the substrate. A trench is formed in the first layer adjacent the first gate structure and extends from a height of about d to the substrate. A connector is formed in the trench between the substrate and a layer of the finFET above the first layer. The process of forming the connector comprises; forming a thin film oxide on the sidewalls of the trench extending from a height below h to about d; forming a liner in the trench, extending over the substrate and on the sidewalls to about the height d over the thin film oxide and forming a layer of tungsten in the trench over the liner.

20 Claims, 9 Drawing Sheets

METHODS, APPARATUS, AND SYSTEM FOR FABRICATING FINFET DEVICES WITH INCREASED BREAKDOWN VOLTAGE

BACKGROUND OF THE INVENTION

Field of the Invention

Generally, the present disclosure relates to the manufacture of sophisticated semiconductor devices, and more specifically, to various methods for fabricating finFET devices having increased breakdown voltages.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decreased separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

FinFET designs use "fins" that may be formed on the surface of a semiconductor wafer using selective-etching processes. The fins may be used to form a raised channel between the gate and the source and drain of a transistor. The gate is then deposited such that it wraps around the fin to form a trigate structure. Since the channel is extremely thin, the gate would generally have a greater control over the carriers within. However, when the transistor is switched on, the shape of the channel may limit the current flow. Therefore, multiple fins may be used in parallel to provide greater current flow for increased drive strength.

FIG. 1A illustrates a stylized depiction of a state-of-the-art finFET device. A conventional finFET device 100 illustrated in FIG. 1A comprises a plurality of fins 110. The source and drain of the finFET are placed horizontally along the fins 110. High-k metal gates 120 wrap over the fins 110, covering each fin 110 on three sides.

The thickness of the fin (labeled $T_{fi}$) determines the short channel behavior of the transistor device and is usually small in comparison with the height H of the fin 110. The pitch (labeled P) of the fins is determined by lithographic constraints and dictates the wafer area to implement the desired device width. A small value of the pitch P and a large value of the height H enable a better packing of the devices per square area resulting in a denser design, or more efficient use of silicon wafer area.

The scaling down of integrated circuits coupled with higher performance requirements for these circuits have prompted an increased interest in finFETs. FinFETs generally have the increased channel widths, which includes channel portions formed on the sidewalls and top portions of the fins. Since drive currents of the finFETs are proportional to the channel widths, finFETs generally display increase drive current capabilities.

Those skilled in the art will appreciate that a significant number of interconnections must be made between, and to, the components of the finFETs such that routing of the interconnections may be complicated and densely packed. For example, referring now to FIG. 1B, a connection in the conventional finFET device 100 between the drain regions of the fins 110 and upper layers (e.g., the metal layer) is stylistically represented by the connector 150. Similar connections, such as those represented by the connector 160 may be made between other components on different layers.

A stylistic cross section of the conventional finFET 100, taken along the lines 1C of FIG. 1B, is illustrated in FIG. 1C. The connector 150 is adjacent the gate 120, and, owing to its tapered shape, approaches the gate 120 at its closest point at about the top edge of the gate 120. The distance between the gate 120 and the connector 150 at this location is represented by X in FIG. 1C. In the operation of the finFET device 100, the voltages applied to the gate 120 and connector 150 can differ only by a preselected maximum amount, otherwise voltage breakdown will occur therebetween. Exceeding the breakdown voltage may lead to erroneous operation of the finFET device 100.

A stylistic cross section of the conventional finFET 100, taken along the lines 1D of FIG. 1B, is illustrated in FIG. 1D. The connector 160 is adjacent the connector 150, and, owing to the tapered shape of the connector 150, approaches the connector 160 at its closest point at about the top edge of the connector 160. The distance between the connectors 150, 160 at this location is represented by Y in FIG. 1D. In the operation of the finFET device 100, the voltages applied to the connectors 150, 160 can differ only by a preselected maximum amount; otherwise voltage breakdown will occur at this location as well.

As scaling down continues in the semiconductor industry, the physical structures of the finFET devices become smaller and spacing therebetween is reduced. Accordingly, breakdown voltage may also be reduced, forcing the finFET devices to be operated at lower voltages or with greater voltage differentials so as to avoid voltage breakdown, particularly with respect to those regions, such as X and Y, that have minimal spacing.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a method of forming a fin field effect transistor (finFET). The method comprises forming a first gate structure on a substrate of a semiconductor wafer in a first layer, the gate structure extending to a height of about h above the substrate. A trench is formed in the first layer adjacent the first gate structure and extends from a height of about d to the substrate. A connector is formed in the trench between the substrate and a layer of the finFET above the first layer. The process of forming the connector comprises; forming a thin film oxide on the sidewalls of the trench extending from a height below h to about d; forming a liner in the trench extending over the substrate and on the sidewalls to about the height d over the thin film oxide; and forming a layer of tungsten in the trench over the liner.

In another aspect of the present invention, a fin field effect transistor (finFET), comprising a substrate, a gate structure and a connector is provided. The gate structure is formed on the substrate and extends to a height h above the substrate. The connector is formed on the substrate adjacent the gate structure and extends to a height d above the gate structure. The connector comprises a thin film oxide, a liner and a layer of tungsten. The thin film oxide is formed on the sidewalls of the connector and extends from a height below h to about d. The liner extends over the substrate to about the height d over the thin film oxide. A layer of tungsten is formed over the liner.

In another aspect of the present invention, a system is provided that comprises a semiconductor device processing system and a processing controller in which the semiconductor device processing system manufactures a semiconductor device comprising at least one fin field effect transistor (finFET). The processing controller is operatively coupled to the semiconductor device processing system, and is configured to control an operation of the semiconductor device processing system. The semiconductor device processing system is adapted to: form a first gate structure on a substrate of a semiconductor wafer in a first layer, the gate structure extending to a height of about h above the substrate; form a trench in the first layer adjacent the first gate structure and extending from a height of about d to the substrate. A connector is formed in the trench between the substrate and a layer of the finFET above the first layer. The process of forming the connector comprises; forming a thin film oxide on the sidewalls of the trench extending from a height below h to about d; forming a liner in the trench extending over the substrate and on the sidewalls to about the height d over the thin film oxide; and forming a layer of tungsten in the trench over the liner.

BRIEF DESCRIPTION OF THE DRAWINGS

The disclosure may be understood by reference to the following description taken in conjunction with the accompanying drawings, in which like reference numerals identify like elements, and in which.

Figure 1A:
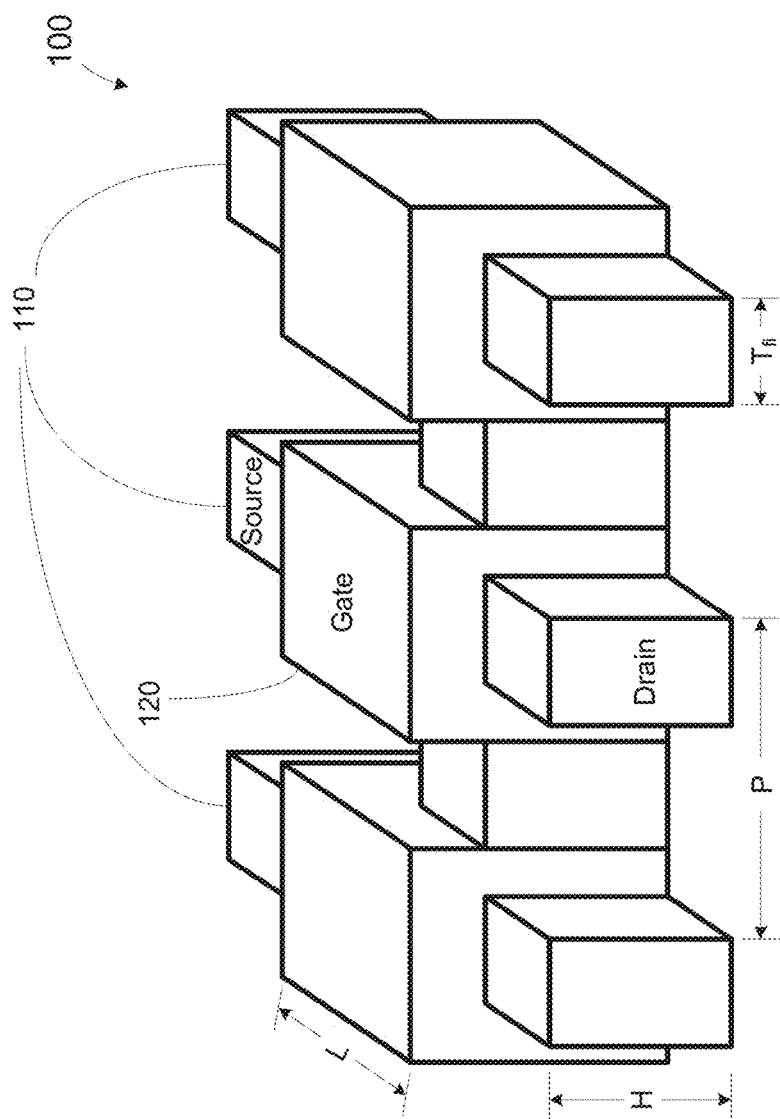
FIGS. 1A-1B illustrate a stylized perspective view of a state-of-the-art finFET device.
Figure 1B:
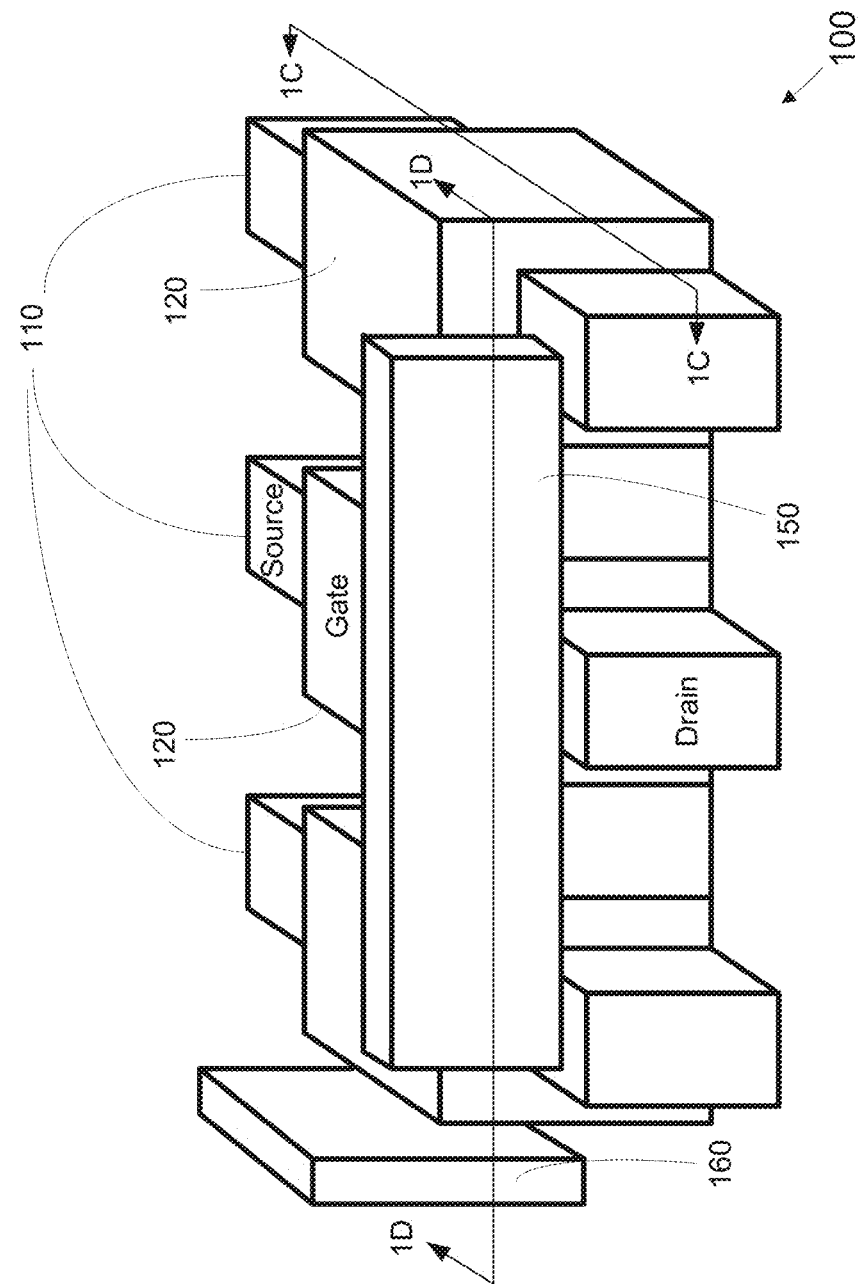

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached Figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for a design that may be implemented in high density circuits, such as 14 nm and/or smaller designs. Embodiments herein provide for a middle of line (MOL) architecture that comprises, for example, a full stripe trench silicide (TS) feature and V0 contacts. Embodiments herein also provide for a protective layer being formed atop the TS feature.

Embodiments herein provide for an integrated circuit comprising finFET devices, wherein the finFET devices comprise source/drain contact features. The source/drain contact feature of embodiments herein may comprise a full stripe TS feature and a contact feature for providing a connection to a metal feature.

Figure 2:
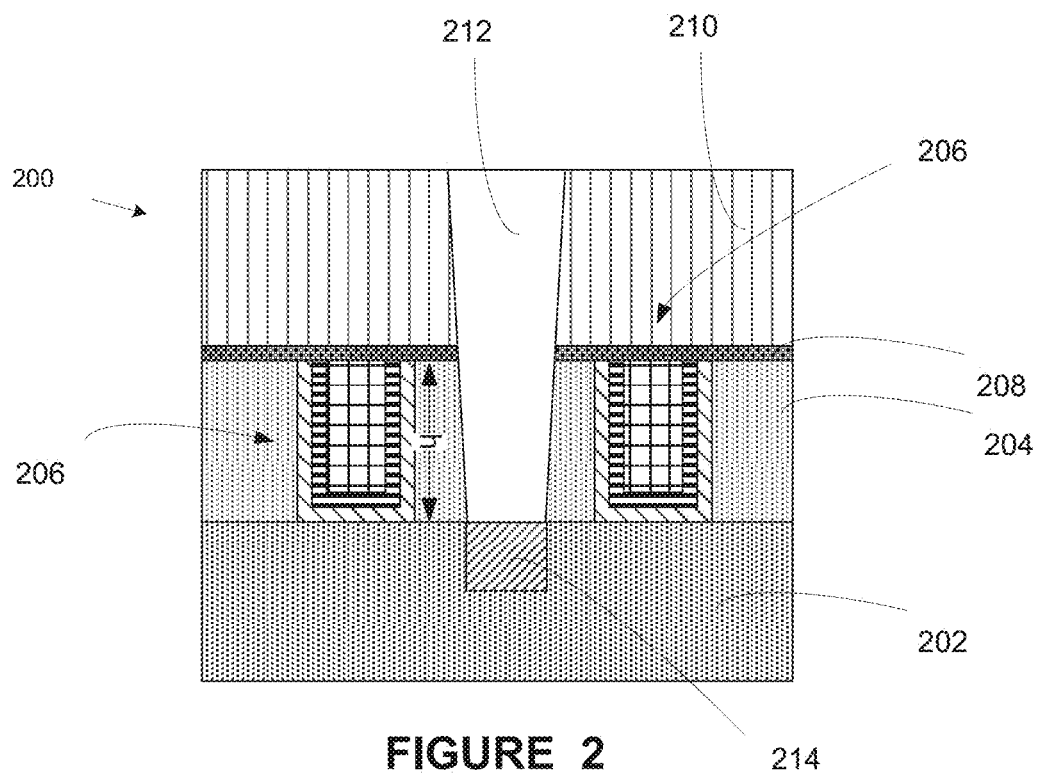
FIG. 2 illustrates a stylized depiction of a cross sectional side view of a finFET device during its construction, including the formation of a trench to the S/D regions.

FIGS. 2-11 illustrate stylized cross-sectional depictions of a vertical finFET device under various stage of manufacture, in accordance with embodiments herein. Turning first to FIG. 2, a stylized cross section of a partially constructed finFET 200 is shown. At this stage of manufacture, the finFET 200, in accordance with embodiments herein, may include, for example, a substrate layer 202 (e.g., silicon substrate, silicon germanium substrate, etc.). In some embodiments, the substrate layer 202 may be comprised of two layers, such as a base layer (not shown) and a substrate layer. Using one of various techniques known to those skilled in the art, a plurality of gate structures 206 are formed within a subsequent layer 204. The layer 204 may take the form of TOSZ/HDP oxide, silicon dioxide (SiO2), or the like. In various embodiments, the gate structures 206 may include, for example, a layer of HK, a layer of TiN or TiC, and a layer of tungsten (w). The finFET device 200, and in particular the gate structures 206, may be subsequently covered with a layer of CSEL 208 and a layer of TEOS 210.

FIG. 2 illustrates the vertical finFET device 200 under manufacture with respect to a trench formation process, in accordance with embodiments herein. An etch process is performed to form a trench 212 that extends through the TEOS layer 210 and into the substrate 202. While not illustrated in the accompanying drawings for the sake of clarity and ease of description, those skilled in the art having benefit of the present disclosure will readily appreciate that a plurality of trench features 212 may be formed between and adjacent the gate structures 206. In some embodiments, a trench RIE (i.e., a silicon ME) process may be performed to etch a portion of the base layer 202 to a predetermined depth (e.g., from a range of about 5 nm to about 120 nm), and in some embodiments, about 40 nm. The trench RIE process is performed in such a manner that a plurality of trenches 212 may be formed between adjacent gate structures 206.

FIG. 2 also illustrates a stylized cross-sectional depiction of the vertical finFET device under manufacture with respect to a source/drain (S/D) epitaxial (EPI) layer deposition/growth process, in accordance with embodiments herein. A conventional EPI deposition/growth process may be performed to form a plurality of bottom EPI features 214 in a portion of each of the trenches 212.

Those skilled in the art having benefit of the present disclosure would appreciate that a plurality of process steps are performed to form EPI features 214 in the bottom of the trenches 212, which correspond to source/drain regions. In some embodiments, the EPI features 214 may be grown to a size in the range of about 5 nm to about 20 nm (lateral EPI width). The EPI features 214 may be deposited using an ultra-high vacuum chemical vapor deposition process (CVD) process (UHVCVD). The precursors for the EPI features 214 may comprise gases comprising silicon (e.g., $SiH_4$, $Si_2H_4Cl_2$, $Si_2H_6$, $Si_3H_8$) and/or gases comprising germanium (e.g., $GeH_4$). The partial pressures of these gases may be varied to adjust the atomic ratio of germanium to silicon. In one embodiment, the EPI features 214 may be grown at a temperature of 700° C., and the temperature may be decreased to 550° C. with source gas.

The deposition of the bottom EPI features 214 may be performed as a plurality of deposition-etch cycles. Various process steps known to those skilled in the art may be performed with regard to forming the EPI features 214, including spacer RIE, EPI pre-clean processes, etc.

Figure 3:
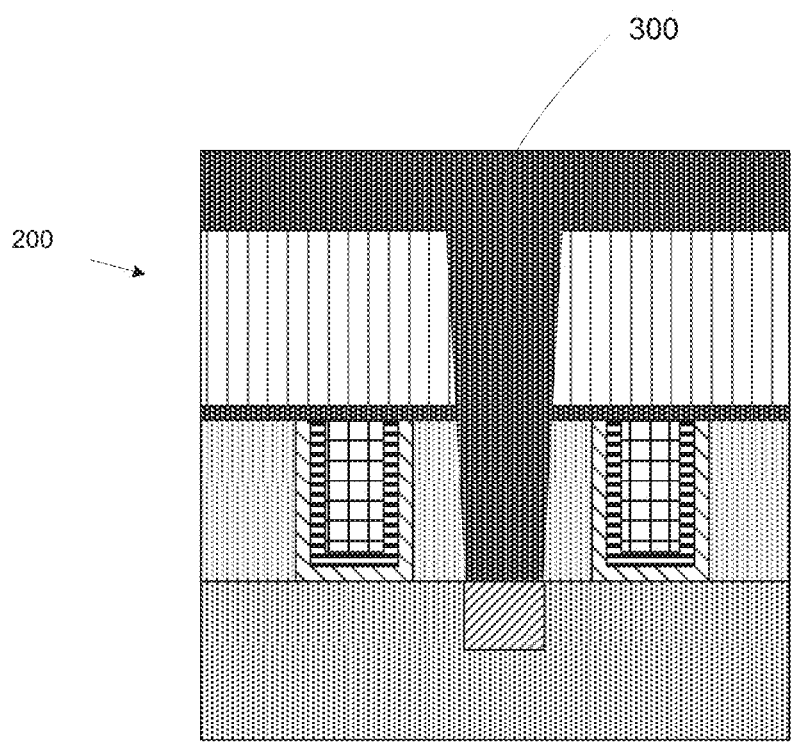
FIG. 3 illustrates a stylized depiction of a cross sectional side view of a finFET device during its construction, including the formation of an OPD layer in trench.

Turning now to FIG. 3, a stylized cross-sectional depiction of the vertical finFET device under manufacture with respect to an organic planarization layer (OPL) deposition process, in accordance with embodiments herein, is shown. An OPL deposition process may be performed to produce a layer of OPL 300 that extends over the TEOS layer 210 and into the trench 212. In some embodiments, the OPL layer 300 may comprise photoresist material.

Figure 4:
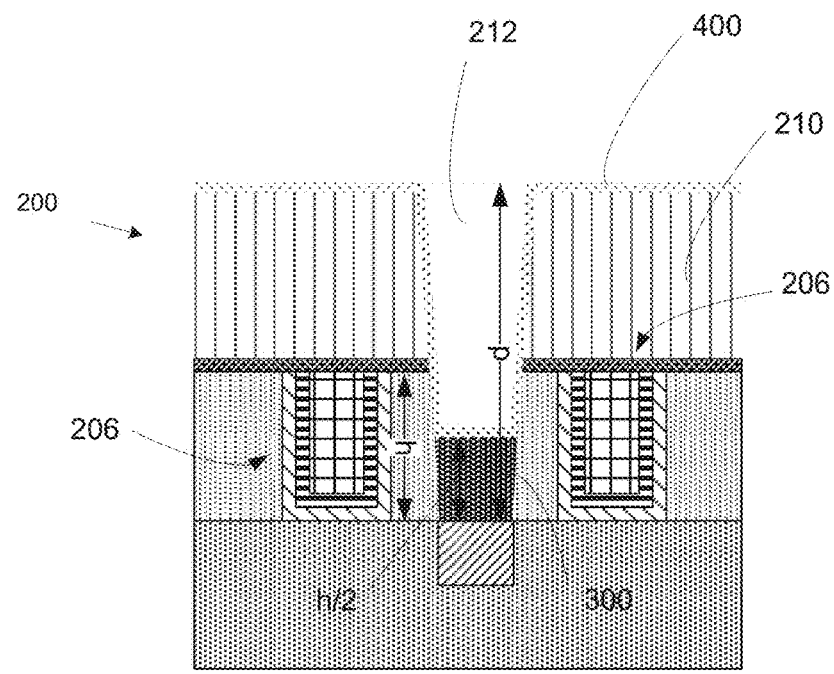
FIGS. 4-6 illustrate stylized depictions of a cross sectional side view of a finFET device during its construction, including the formation of a thin film oxide layer on at least a portion of the sidewalls of the trench.

Turning now to FIG. 4, a stylized cross-sectional depiction of the vertical finFET device under manufacture with respect to a process for removing a portion of the OPL layer 300, in accordance with embodiments herein, is shown. In one embodiment, it is useful for the OPL layer 300 to be removed to a level that falls below the top surface of the gate structure 206. Moreover, in some embodiments it is useful to remove the layer 300 to a height that coincides with about the mid or half height (h/2) of the gate structures 206. In other embodiments, the OPL layer 300 may be removed to a higher or lower height than the height (h/2). Those skilled in the art having benefit of the present disclosure will appreciate that any of a variety of well-known techniques for removing the OPL layer 300 may be employed. In some embodiments, it may be useful to employ a gas-only ashing process to successfully remove organic residues from the trench 212. In this gas-only ashing process it may prove beneficial to avoid the use of DHF and $O_2$. In some embodiments, a plasma ashing process may be employed to remove photoresist material from the OPL layer 300. In one embodiment, $H_2$ gas may be used to ash and remove the OPL layer 300.

Further, as illustrated in FIG. 4, a thin film deposition process may be performed. For example, atomic layer deposition (ALD) may be used to produce a thin film 400 of oxide over the top surface of the layer of TEOS 210 and on both the sidewalls and the bottom of the trench 212. In one embodiment, it may be useful to use a process and an oxide, such as SiO2, that have a relatively low thermal budget range, such as from about 100° C. to about 540° C. In one embodiment, the thin film 400 may have a thickness in the range of about 1 nm to about 2 nm on the sidewalls of the trench 212. In one embodiment, the thin ALD oxide 400 may be produced using a product from Applied Materials known as Allure™.

Figure 5:
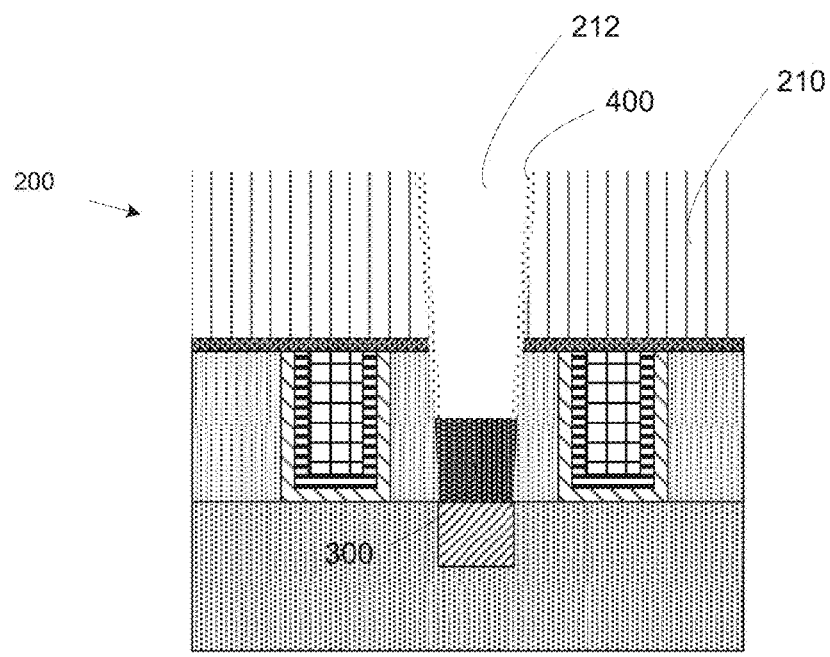

Turning now to FIG. 5, a stylized cross-sectional depiction of the vertical finFET device under manufacture with respect to a process for removing a portion of the thin film 400, in accordance with embodiments herein, is shown. In one embodiment, it is useful to employ a dry etch process to remove the thin film 400 from the horizontal surfaces of the finFET device 200, such as from the top surface of the TEOS layer 210 and the top surface of the OPL layer 300 in the bottom of the trench 212. Therefore, a portion of the thin film 400 remains on a portion of the side walls of the trench 212. In one embodiment, the thin film 400 remains on the sidewall of the trench 212 to a height of that of the OPL layer 300 remaining in the trench 212. In other embodiments, the thin film 400 remaining on the sidewalls of the trench 212 may be at a lower or at a higher height than the height of the OPL layer 300. Those skilled in the art having benefit of the present disclosure will appreciate that any of a variety of conventional dry etch processes may be utilized.

Figure 6:
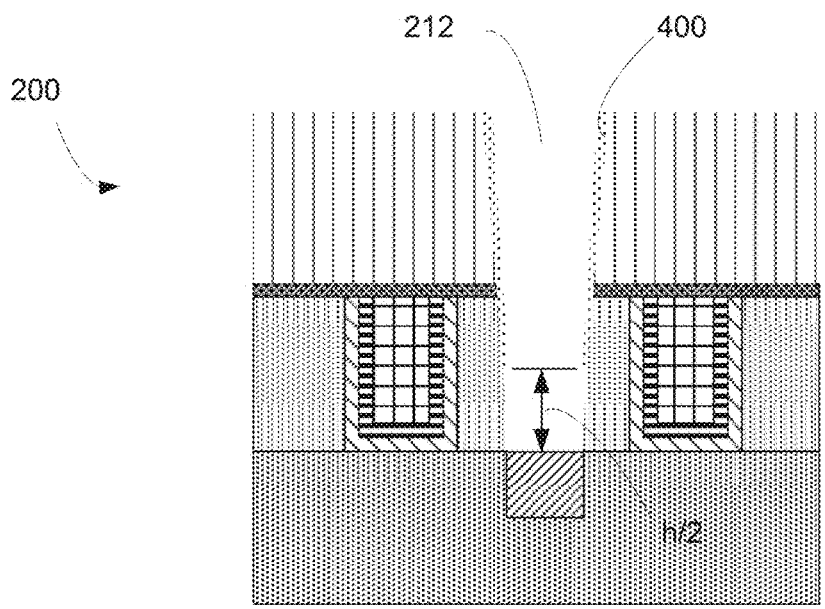

Turning now to FIG. 6, a stylized cross-sectional depiction of the vertical finFET device under manufacture with respect to a process for removing the OPL layer 300, in accordance with embodiments herein, is shown. In one embodiment, it is useful to remove all of the OPL 300 that remains in the bottom of the trench 212. Those skilled in the art will appreciate that a process substantially similar to the process discussed above in conjunction with FIG. 4 may be utilized here to remove the remaining portion of the OPL layer 300. With the OPL layer 300 substantially removed from the trench 212, the thin oxide layer 400 remains on a portion of the sidewalls of the trench 212 from the height of about h/2 (which, in one embodiment, generally corresponds to about the half or mid height of the gate structures 206, to the top of the trench 212. In other embodiments, the height of the OPL layer 300 may be higher than h, and in yet other embodiments, the height h of the OPL layer 300 may be lower than h. In some alternative embodiments, the OPL layer 300 deposition and etch processing may be eliminated and the thin oxide layer 400 may be formed on the entirety of the sidewalls of the trench 212. However, those skilled in the art will appreciate that the presence of the thin oxide layer 400 on the entirety of the sidewalls of the trench 212 will produce a smaller contact area with the source/drain region, which may increase contact resistance and degrade device performance. In some applications, the tradeoff between higher contact resistance and a simplified manufacturing process may be acceptable.

Figure 7:
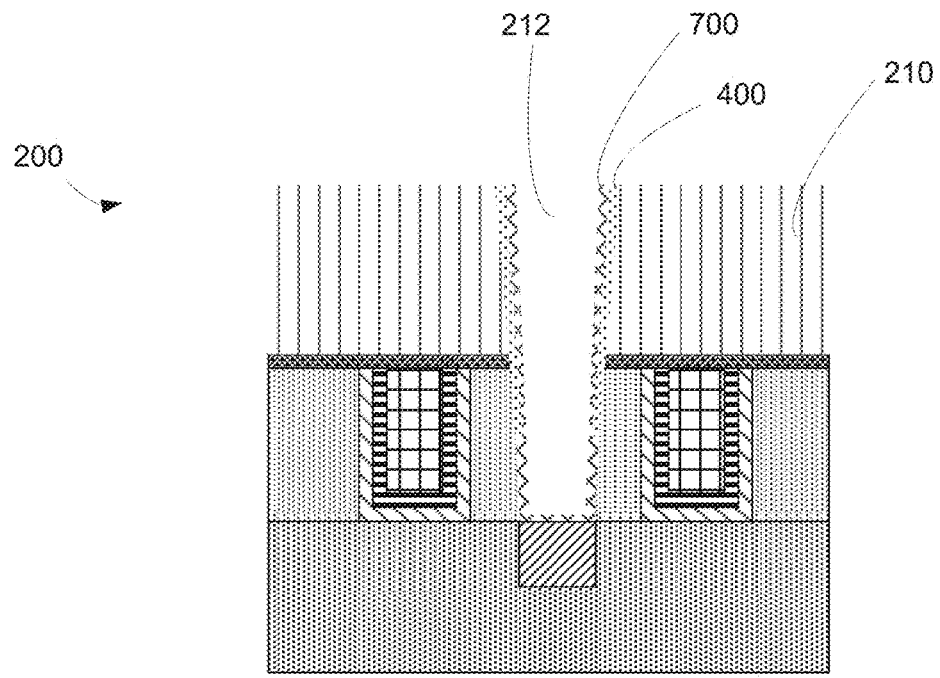
FIG. 7 illustrates a stylized depiction of a cross sectional side view of a finFET device during its construction, including the formation of a liner of titanium or titanium nitride on at least a portion of the sidewalls of the trench and over the thin film oxide.

Turning now to FIG. 7, a stylized cross-sectional depiction of the vertical finFET device under manufacture with respect to a process for depositing a liner 700, in accordance with embodiments herein, is shown. In one embodiment, the liner 700 may be of a titanium (Ti) or titanium nitride (TiN) material, In one embodiment, prior to forming the liner 700, a conventional SiCoNi etch process is performed. The SiCoNi process may refer to the SiConi™ etch process, which may refer to a remote plasma assisted dry etch process involving simultaneous exposure of a substrate to H2, NF3, and NH3 plasma by-products. This process is followed by a deposition of a layer of Ti or TiN on the sidewalls and bottom surface of the trench 212, including overlying the thin film 400, forming the liner 700. Thereafter, a dynamic surface anneal (DSA) process is performed.

Figure 1C:
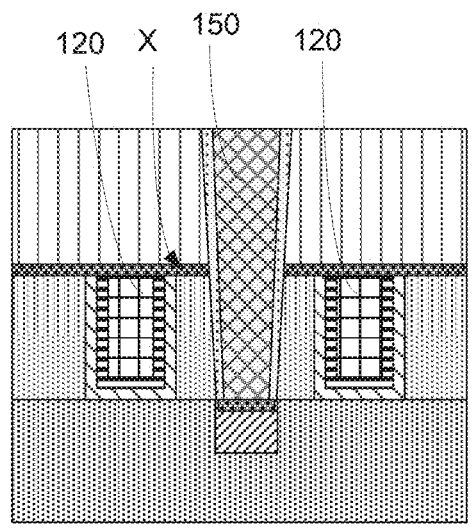
FIGS. 1C-1D illustrate stylized orthogonal cross-sectional views of the state-of-the-art finFET device.
Figure 1D:
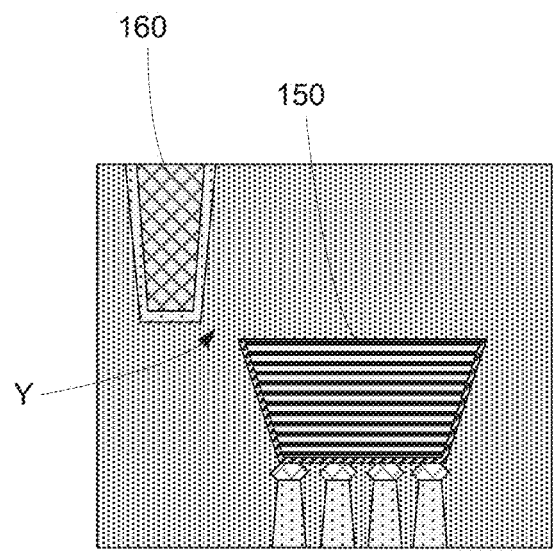
Figure 8:
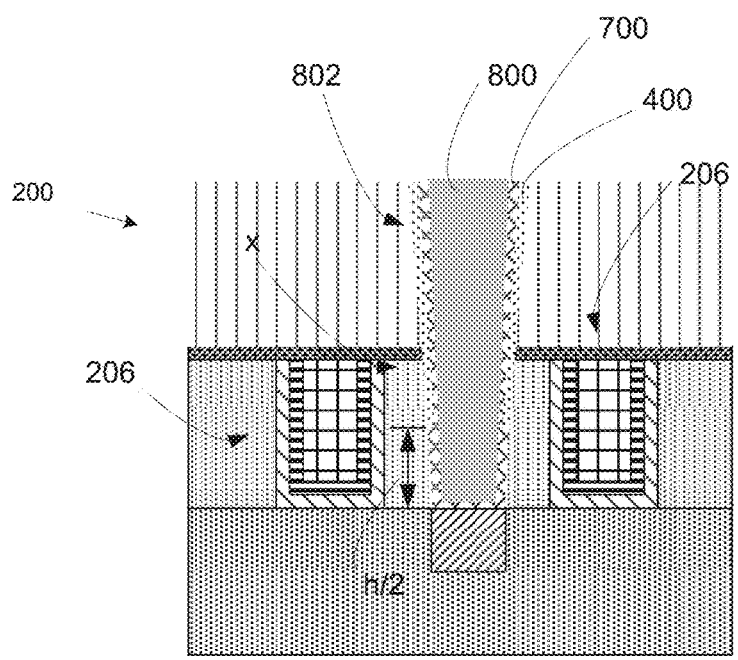
FIG. 8 illustrates a stylized depiction of a cross sectional side view of a finFET device during its construction, including the formation of a layer of tungsten within the trench.

Turning now to FIG. 8, a stylized cross-sectional depiction of the vertical finFET device under manufacture with respect to a process for depositing a layer 800 of metal, in accordance with embodiments herein, is shown. In one embodiment, the metal material, e.g., tungsten (W), is deposited in and substantially fills the trench 212 to form a connector 802 between the S/D region of the finFET device 200 and an upper layer, such as the metallization layer of the finFET device 200. Those skilled in the art would appreciate that additional processes, such as etch back process, chemical-mechanical polishing (CMP) may be performed As discussed in the background section of the instant application the distance between the connector 802 and the gate structure 206 is at a minimum value at about the top edge of the gate structure 206. The distance between the gate 206 and the connector 802 at this location is represented by X in FIG. 8. Unlike the prior art discussed in FIG. 1C, the connector 802 includes the thin film oxide 400 extending from a predetermined height (e.g., about the half-height of the gate structure 206) to the top of the connector 802, thereby substantially isolating the connector 802 from the gate structure 206 such that the breakdown voltage therebetween is greater, allowing for a larger voltage difference therebetween.

Figure 9:
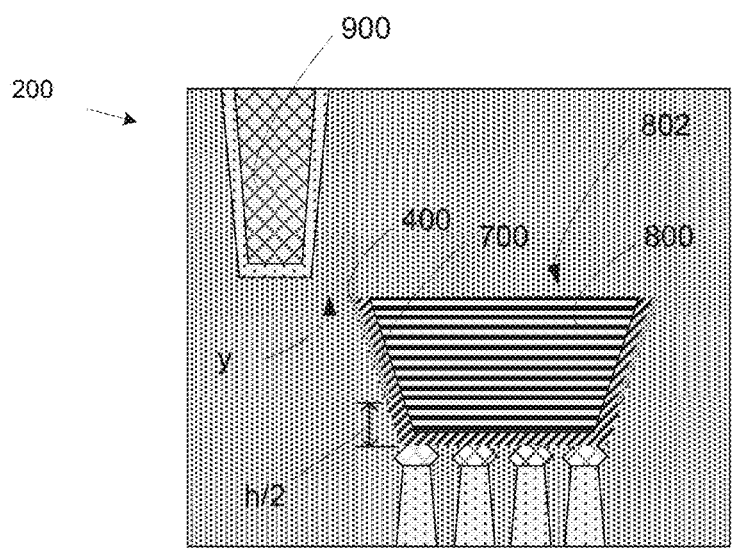
FIG. 9 illustrates a stylized depiction of an orthogonal cross sectional side view of the finFET device of FIG. 8.

Turning now to FIG. 9, an alternative view of a stylized cross-sectional depiction of the vertical finFET device under manufacture, in accordance with embodiments herein, is shown. FIG. 9 depicts an orthogonal view to that shown in FIG. 8. In this view an additional connector 900 and its proximity to the connector 802 is shown. The minimal distance between the connectors 802 and 900 is represented by the letter Y in FIG. 9. Like the distance X shown in FIG. 8, the distance Y can impact the breakdown voltage between the connectors 802 and 900. The thin film oxide 400 extends along the upper edge of the connector 802 adjacent the connector 900 to substantially isolate the structures and allow for a greater voltage differential therebetween. As discussed above in conjunction with at least FIG. 8, the thin film oxide 400 extends from a height h that generally corresponds to the half or mid-height of the gate structure 206 (not shown in FIG. 9). Those skilled in the art will appreciate that the thin film oxide 400 extends about the entire periphery of the connector 802 from the height h to the top of the connector 802, thereby operating to isolate the connector 802 from any nearby structures, such as the connector 900 and the gate structure 206.

Figure 10:
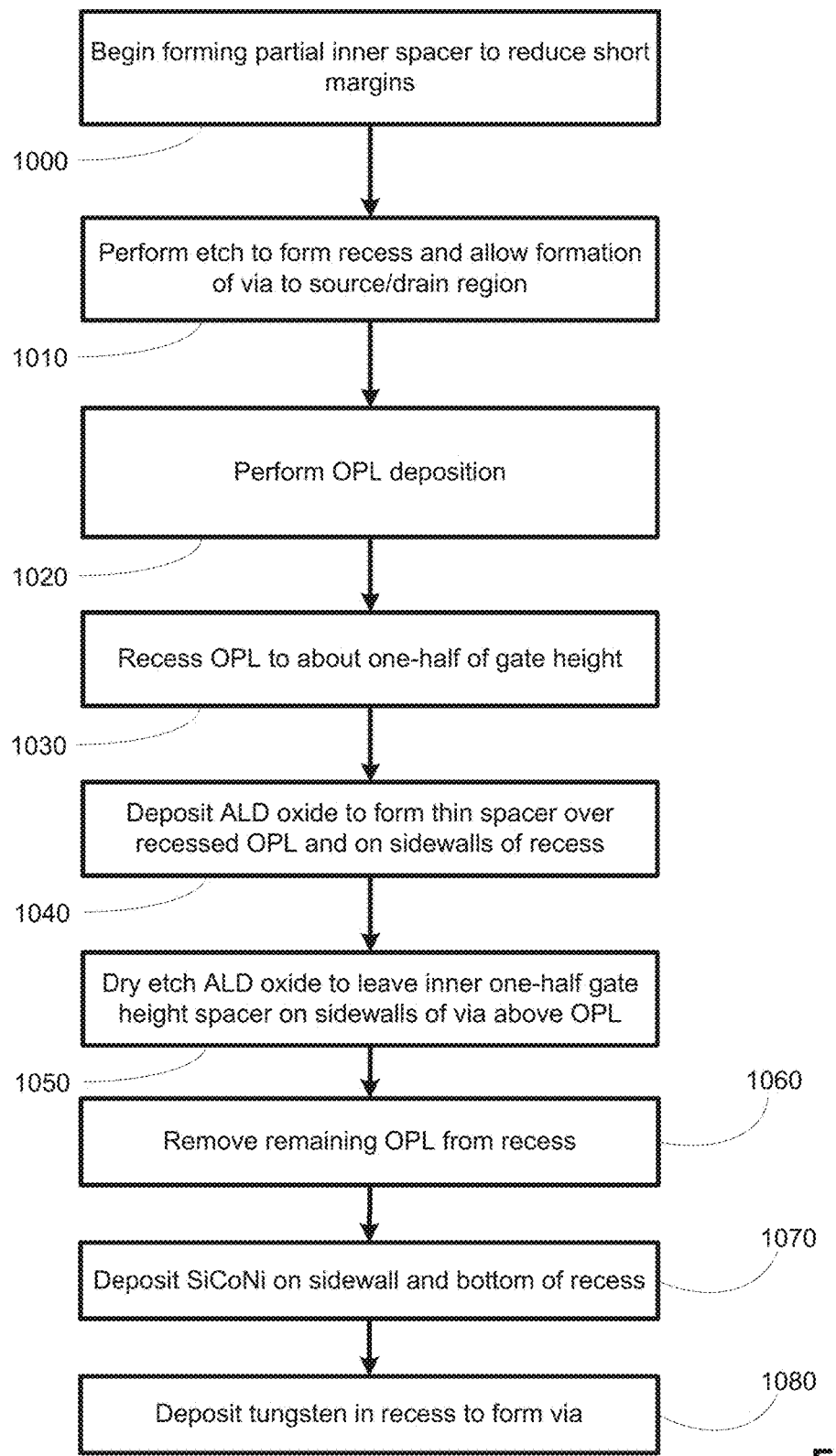
FIG. 10 illustrates a flowchart depiction of a method for providing a finFET device, in accordance with embodiments herein.

Turning now to FIG. 10, a flowchart depiction of a method for providing the thin film oxide 400 to allow for increased breakdown voltage, in accordance with embodiments herein, is illustrated. The process for forming a spacer to reduce short margins between adjacent structures in a finFET device begins at block 1000. The first step in the process is set forth in block 1010 where an etch process is utilized to create a trench 212 in which a connector, such as an S/D via, is to be constructed (see FIG. 2). At block 1020, an OPL layer 300 is deposited, substantially filling the trench (see FIG. 3). The OPL layer 300 is useful for establishing the height h at which the thin film oxide 400 will be formed. For example, at block 1030, the OPL layer 300 is recessed to the height h, which corresponds to about the mid or half-height of the gate structure 206 (see FIG. 4). The thin film oxide 400 is deposited over the finFET device 200, including the OPL 300 that remains in the bottom of the trench 212 and on the sidewalls of the trench 212 above the OPL 300 at block 1040. Thereafter, at block 1050, the thin film oxide 400 is removed from all horizontal surfaces of the finFET 200, leaving the thin film oxide 400 only on the sidewalls of the trench 212 above the half or mid-height of the gate structure 206. The remaining OPL layer 300, having served its purpose of establishing the bottom of the thin film oxide 400 at the half or mid-height of the gate structure 206 is removed by at block 1060. Thereafter, at blocks 1060 and 1070, the connector structure 802 is completed by performing a SiCoNi etch followed by the deposition of a layer of tungsten.

Figure 11:
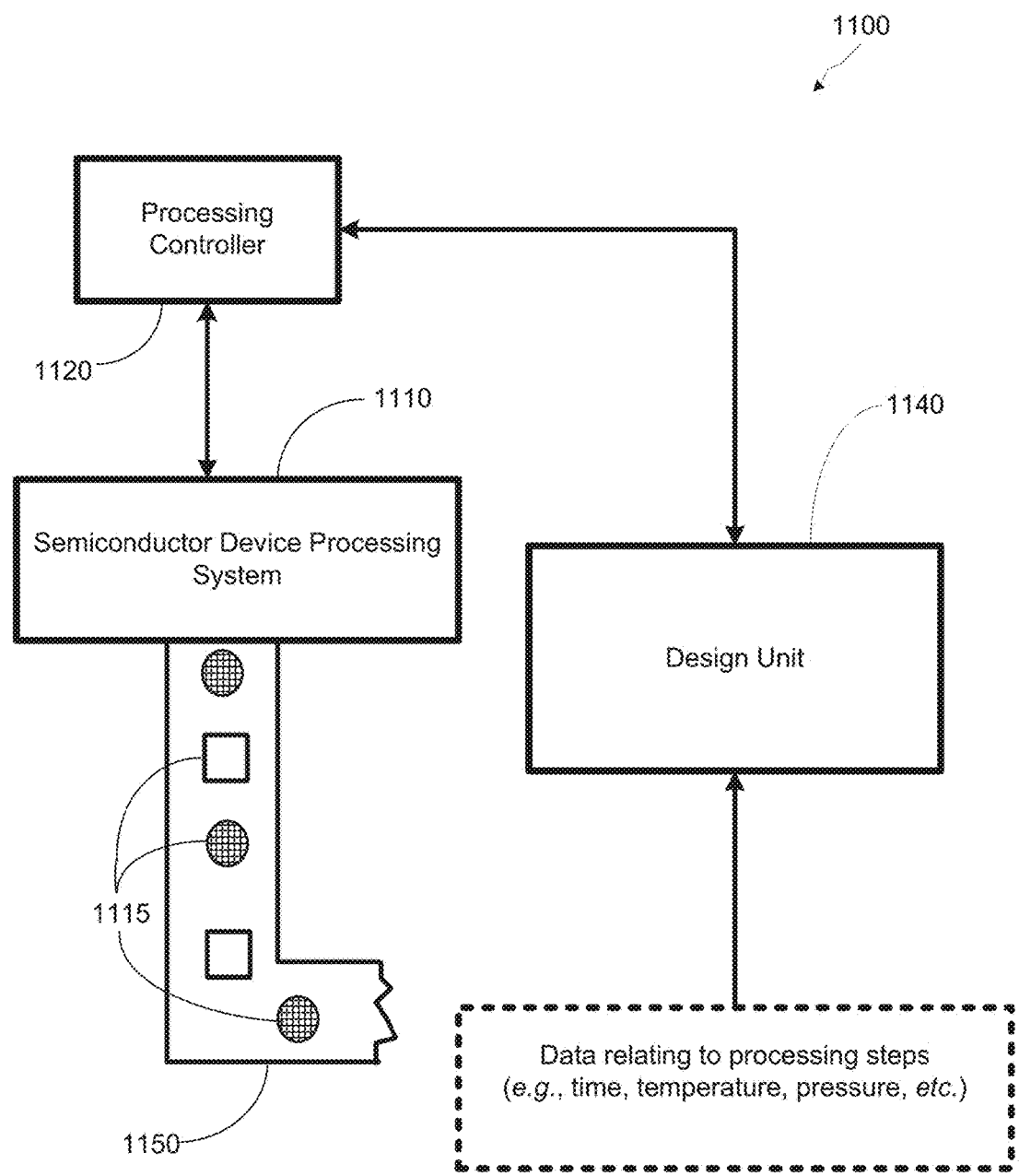
FIG. 11 illustrates a stylized depiction of a system for fabricating semiconductor devices comprising finFET devices having an improved breakdown voltage, in accordance with embodiments herein.

Turning now to FIG. 11, a stylized depiction of a system for fabricating a semiconductor device package comprising a finFET device having a thin film oxide that allows for greater breakdown voltage, in accordance with embodiments herein, is illustrated. The system 1100 of FIG. 11 may comprise a semiconductor device processing system 1110 and a design unit 1140. The semiconductor device processing system 1110 may manufacture integrated circuit devices based upon one or more designs provided by the design unit 1140.

The semiconductor device processing system 1110 may comprise various processing stations, such as etch process stations, photolithography process stations, CMP process stations, etc. One or more of the processing steps performed by the processing system 1110 may be controlled by the processing controller 1120. The processing controller 120 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1110 may produce integrated circuits on a medium, such as silicon wafers. More particularly, the semiconductor device processing system 1110 produce integrated circuits having finFET devices that comprise a thin film oxide layer that allows for greater breakdown voltage, as described above.

The production of integrated circuits by the device processing system 1110 may be based upon the circuit designs provided by the design unit 1140. The processing system 1110 may provide processed integrated circuits/devices 1115 on a transport mechanism 1150, such as a conveyor system. In some embodiments, the conveyor system may be sophisticated clean room transport systems that are capable of transporting semiconductor wafers. In one embodiment, the semiconductor device processing system 1110 may comprise a plurality of processing steps, e.g., the $1^{st}$ process step, the $2^{nd}$ process set, etc., as described above.

In some embodiments, the items labeled "1115" may represent individual wafers, and in other embodiments, the items 1115 may represent a group of semiconductor wafers, e.g., a "lot" of semiconductor wafers. The integrated circuit or device 1115 may be a transistor, a capacitor, a resistor, a memory cell, a processor, and/or the like. In one embodiment, the device 1115 is a transistor and the dielectric layer is a gate insulation layer for the transistor.

The design unit 1140 of the system 1100 is capable of providing a circuit design that may be manufactured by the semiconductor processing system 1110. The design unit 1140 may be capable of effecting the composition of adjacent structures of a device such that they are substantially isolated from one another to allow for a greater voltage differential therebetween. The integrated circuit design unit 1140 may also determine the height and thickness of the thin film oxide, the dimensions of the gate structures and the various connectors therein, etc., of the finFET devices. These dimensions may be based upon data relating to drive currents/performance metrics, device dimensions, etc. Based upon such details of the devices, the integrated circuit design unit 1140 may determine specifications of the finFETs that are to be manufactured. Based upon these specifications, the integrated circuit design unit 1140 may provide data for manufacturing a semiconductor device package described herein.

The system 1100 may be capable of performing analysis and manufacturing of various products involving various technologies. For example, the system 1100 may design and production data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming a fin field effect transistor (finFET), comprising:
   forming a first gate structure on a substrate of a semiconductor wafer in a first layer, the gate structure extending to a first height above the substrate;
   forming a trench in the first layer adjacent the first gate structure and extending to a second height above the substrate, wherein the second height is above the first height; and
   forming a connector in the trench between the substrate and a layer of the finFET above the first layer, wherein forming the connector comprises;
      forming a thin film oxide on the sidewalls of the trench extending from a third height to the second height, wherein the third height is above the substrate and below the first height;
      forming a liner in the trench on the substrate and extending on the sidewalls from the substrate to about the second height over the thin film oxide; and
      forming a layer of metal in the trench over the liner.

2. The method of claim 1, wherein the third height is about one-half of the first height.

3. The method of claim 1, wherein forming the thin film oxide on the sidewalls of the trench extending from the third height to about the second height further comprises forming the thin film oxide using atomic layer deposition (ALD).

4. The method of claim 1, wherein forming the thin film oxide on the sidewalls of the trench extending from the third height to about the second height further comprises forming the thin film oxide having a thickness in a range of about 1 nm to about 2 nm.

5. The method of claim 1, wherein forming a thin film oxide on the sidewalls of the trench extending from the third height to about the second height further comprises forming a layer of OPL in the trench to the third height and forming a thin film oxide on the sidewalls of the trench and over the OPL.

6. The method of claim 5, wherein forming the thin film oxide on the sidewalls of the trench further comprises removing the thin film oxide from the surface of the OPL and removing the OPL from the trench.

7. The method of claim 6, wherein removing the OPL from the trench further comprises using a gas-only ashing process to remove the OPL.

8. The method of claim 1, wherein forming the liner in the trench further comprises depositing a layer of titanium (Ti) or titanium nitride (TiN).

9. A fin field effect transistor (finFET), comprising:
   a substrate;
   a gate structure formed on the substrate and extending to a first height above the substrate; and a connector formed on the substrate adjacent the gate structure and extending to a second height above the gate structure, the connector comprising,
  a thin film oxide on the sidewalls of the connector extending from a third height to about the second height, wherein the third height is below the first height;
  a liner extending from the substrate to about the second height over the thin film oxide; and
  a layer of tungsten over the liner.

10. The finFET of claim 9, wherein the third height is about half of the first height.

11. The finFET of claim 9, wherein the thin film oxide on the sidewalls of the connector has a thickness in a range of about 1 nm to about 2 nm.

12. The finFET of claim 9, wherein the connector formed on the substrate adjacent the gate structure further comprises the connector being formed on a source/drain region in the substrate.

13. The finFET of claim 9, wherein the liner further comprises a layer of titanium (Ti) or titanium nitride (TiN).

14. A system, comprising:
  a semiconductor device processing system to manufacture a semiconductor device comprising at least one fin field effect transistor (finFET); and
  a processing controller operatively coupled to said semiconductor device processing system, said processing controller configured to control an operation of said semiconductor device processing system;
  wherein said semiconductor device processing system is adapted to:
  form a first gate structure on a substrate of a semiconductor wafer in a first layer, the gate structure extending to a first height above the substrate;
  form a trench in the first layer adjacent the first gate structure and extending to a second height above the substrate; and
  form a connector in the trench between the substrate and a layer of the finFET above the first layer, wherein forming the connector comprises;
    forming a thin film oxide on the sidewalls of the trench extending from a third height to the second height, wherein the third height is above the substrate and below the first height;
    forming a liner in the trench on the substrate and extending on the sidewalls from the substrate to about the second height over the thin film oxide; and
    forming a layer of tungsten in the trench over the liner.

15. The system of claim 14, wherein the third height is about one-half the first height.

16. The system of claim 14, wherein forming the thin film oxide on the sidewalls of the trench further comprises forming the thin film oxide using atomic layer deposition (ALD).

17. The system of claim 14, wherein forming the thin film oxide on the sidewalls of the trench further comprises forming the thin film oxide having a thickness in a range of about 1 nm to about 2 nm.

18. The system of claim 14, wherein forming the thin film oxide on the sidewalls of the trench further comprises forming a layer of OPL in the trench to the third height and forming a thin film oxide on the sidewalls of the trench and over the OPL.

19. The system of claim 18, wherein forming the thin film oxide on the sidewalls of the trench further comprises removing the thin film oxide from the surface of the OPL and removing the OPL from the trench.

20. The system of claim 14, wherein forming the liner in the trench further comprises depositing a layer of titanium (Ti) or titanium nitride (TiN).

* * * * *